United States Patent
Clementi

(10) Patent No.: US 7,782,143 B2
(45) Date of Patent: Aug. 24, 2010

(54) PHASE LOCKED LOOP AND DELAY LOCKED LOOP WITH CHOPPER STABILIZED PHASE OFFSET

(75) Inventor: Daniel M. Clementi, Doylestown, PA (US)

(73) Assignee: Integrated Device Technology, Inc., San Jose, CA (US)

( * ) Notice: Subject to any disclaimer, the term of this patent is extended or adjusted under 35 U.S.C. 154(b) by 0 days.

(21) Appl. No.: 11/683,800

(22) Filed: Mar. 8, 2007

(65) Prior Publication Data

US 2008/0218274 A1 Sep. 11, 2008

(51) Int. Cl.
*H03L 7/00* (2006.01)

(52) U.S. Cl. .............................. 331/16; 331/10; 331/11; 331/34; 331/175

(58) Field of Classification Search ................... 331/2, 331/16, 34, 175, 10, 11
See application file for complete search history.

(56) References Cited

U.S. PATENT DOCUMENTS

| 5,075,640 | A |   | 12/1991 | Miyazawa |
| 5,727,037 | A |   | 3/1998 | Maneatis |
| 5,736,892 | A | * | 4/1998 | Lee ............................. 327/536 |
| 6,043,715 | A |   | 3/2000 | Bailey et al. |
| 6,094,078 | A | * | 7/2000 | Suzuki ........................ 327/156 |
| 6,111,470 | A | * | 8/2000 | Dufour ......................... 331/17 |
| 6,172,571 | B1 | * | 1/2001 | Moyal et al. ................... 331/11 |
| 6,346,838 | B1 | * | 2/2002 | Hwang et al. ................ 327/156 |
| 7,020,793 | B1 | * | 3/2006 | Hsieh .......................... 713/401 |
| 7,061,290 | B2 | * | 6/2006 | Hasegawa .................... 327/157 |
| 7,276,977 | B2 | * | 10/2007 | Self .............................. 331/11 |
| 2001/0052807 | A1 |   | 12/2001 | Vaucher |
| 2005/0207522 | A1 |   | 9/2005 | Lindner et al. |
| 2006/0158274 | A1 |   | 7/2006 | Self |
| 2007/0035348 | A1 |   | 2/2007 | Self |

FOREIGN PATENT DOCUMENTS

| EP | 0637138 A1 | 2/1995 |
| EP | 0695039 A1 | 1/1996 |
| EP | 0805553 A1 | 11/1997 |
| EP | 0844739 A1 | 5/1998 |

OTHER PUBLICATIONS

Chih-Kong Ken Yang; Delay-Locked Loops—An Overview; pp. 13-15, Mar. 2003.

* cited by examiner

*Primary Examiner*—Joseph Chang
*Assistant Examiner*—Jeffrey Shin
(74) *Attorney, Agent, or Firm*—Panitch Schwarze, et al.

(57) ABSTRACT

A control circuit includes a phase frequency detector that receives a reference phase $\Phi_{REF}$ (signal) as an input and a feedback phase $\Phi_{FBK}$ (signal) as control feedback. A voltage controlled oscillator is in electrical communication with the phase frequency detector. The VCO provides an output and the feedback phase $\Phi_{FBK}$ (signal). An auxiliary feedback loop receives error phase $\Phi_E$ (signal) from each of the reference phase $\Phi_{REF}$ (signal) and the feedback phase $\Phi_{FBK}$ (signal). The auxiliary feedback loop provides an adjustment signal to the control circuit to correct for static phase offset.

11 Claims, 7 Drawing Sheets

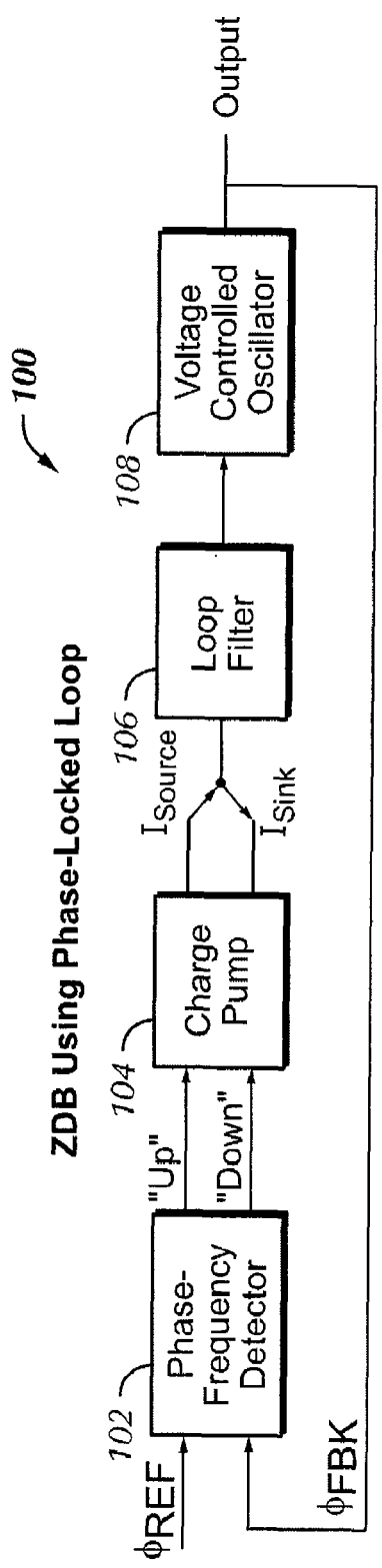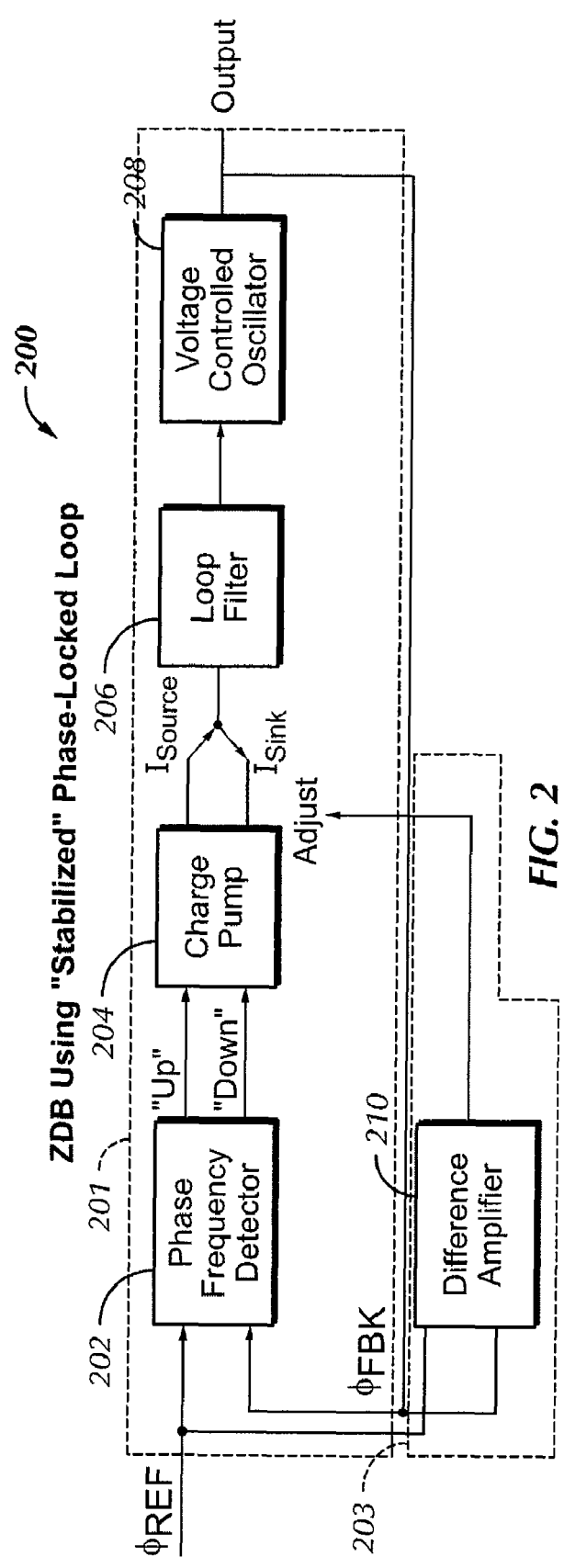
FIG. 1
Prior Art
FIG. 2

PHASE LOCKED LOOP AND DELAY LOCKED LOOP WITH CHOPPER STABILIZED PHASE OFFSET

BACKGROUND OF THE INVENTION

Embodiments of the present invention relate generally to phase and delay locked loops, and more particularly, to a phase locked loop (PLL) or a delay locked loop (DLL) with chopper stabilized phase offset.

One common application for phase-locked loops (PLL) and delay-locked loops (DLL) is the regeneration of a clock signal for local use. In many cases, it is desirable that the regenerated clock signal be phase aligned to the reference clock signal. In principle, the PLL is very well suited to this task. A charge-pump PLL is used herein for this explanation, but it can be shown that the same principle applies to DLLs also. A charge-pump PLL or DLL device used in this way is often referred to as a "zero-delay buffer" (ZDB).

Referring to FIG. 1, an idealized conventional ZDB control circuit 100 using PLL can be viewed as a negative-feedback system. The ZDB control circuit 100 includes a phase frequency detector 102 that receives a clock signal, of reference phase $\Phi_{REF}$, as an input and a clock signal, with feedback phase $\Phi_{FBK}$, as control feedback. The phase frequency detector 102 provides "Up" and "Down" pulse signals to a charge-pump 104. When the reference phase leads (i.e., is earlier in time than) the feedback phase, "Up" pulses are generated that cause the charge-pump to add a quantity of charge to a loop filter 106. The quantity of charge is proportional to the phase difference and will increase the voltage on the loop filter 106 which is coupled to the charge-pump 104 and that, in turn, increases the frequency of a voltage controlled oscillator (VCO) 108. The frequency of the VCO 108 is, in fact, the rate of phase accumulation. So, the phase, $\Phi_{FBK}$, of the feedback clock edges will become advanced in time and closer to the phase of the reference edges. This process will continue until the phases are matched or aligned. Conversely, if the reference phase lags (i.e., is later in time than) the feedback phase, "Down" pulses are generated that will remove charge from the loop filter and the VCO frequency will go down. The phase of the feedback clock edges become delayed in time and closer to the phase of the reference edges. Again, this process will continue until the phases are aligned. The negative feedback seeks to always adjust the output frequency until both inputs to the phase-frequency detector 102 are identical, or aligned, in phase and frequency. Since the output of the VCO is directly connected to the $\Phi_{FBK}$ input, the output now has the same phase and frequency as the $\Phi_{REF}$ input, and thus, the origin of the term "zero-delay buffer." It should be noted that a ZDB may also be used with a frequency divider inserted in the path between VCO output and $\Phi_{FBK}$ input. In this case, the output frequency will be a multiple of the input frequency, but their phases will still be substantially aligned assuming that the divider delay is negligible.

A figure of merit of a ZDB is the average phase difference between the output and the input. This is commonly referred to as "static phase offset" (SPO). In many systems, if the SPO is not zero, or if it changes dynamically over time and temperature changes, the system timing margins will be directly degraded. There are many circuit effects which can cause the static phase offset of such a ZDB 100 to be non-zero, such as mismatch of charge-pump currents, "dead-zone" effect in the phase-frequency detector transfer function, asymmetrical charge transfer of Up and Down signals into the Loop filter, and Loop filter leakage current.

It is desirable to systematically reduce the SPO of a ZDB by a separate feedback loop. It is desirable for the separate feedback loop to be designed in such a way that errors, as described above, may be automatically detected and removed from the measurement. This is done without disturbance of the main loop of the PLL, which is a major advantage. It is desirable that the loop not be taken out of service to self-calibrate the phase detector and charge-pump, even for brief intervals. Interruptions in the normal sampling of phase error reduce the maximum allowable loop bandwidth that can be achieved with stability. It is desirable to provide a phase locked loop (PLL) or a delay locked loop (DLL) with chopper stabilized phase offset.

BRIEF SUMMARY OF THE INVENTION

Briefly stated, an embodiment of the present invention comprises a control circuit that includes a phase frequency detector. The phase frequency detector receives a reference phase $\Phi_{REF}$ (signal) as an input and a feedback phase $\Phi_{FBK}$ (signal) as control feedback. A charge pump is in electrical communication with the phase frequency detector. The phase frequency detector provides up and down pulse signals to the charge-pump. A loop filter is in electrical communication with the charge pump. The charge pump provides source current $I_{Source}$ to the loop filter and receives sink current $I_{Sink}$ back from a node that is coupled to the loop filter. A voltage controlled oscillator is in electrical communication with the loop filter. The VCO provides an output and the feedback phase $\Phi_{FBK}$ (signal). An auxiliary feedback loop determines an error phase $\Phi_E$ (signal) from each of the reference phase $\Phi_{REF}$ (signal) and the feedback phase $\Phi_{FBK}$ (signal). The auxiliary feedback loop provides an adjustment signal to the control circuit to correct for static phase offset.

Another embodiment of the present invention comprises a control circuit that includes a phase detector that receives a reference phase $\Phi_{REF}$ (signal) as an input and a feedback phase $\Phi_{FBK}$ (signal) as control feedback. A variable delay receives the reference phase $\Phi_{REF}$ (signal). The variable delay is controlled by the phase detector. An auxiliary feedback loop receives the reference phase $\Phi_{REF}$ (signal) and the feedback phase $\Phi_{FBK}$ (signal). The auxiliary feedback loop provides an adjustment signal to the control circuit to correct for static phase off-set.

Another embodiment of the present invention comprises a control circuit that includes a primary phase detector that receives a reference phase $\Phi_{REF}$ (signal) as an input and a feedback phase $\Phi_{FBK}$ (signal) as control feedback, a voltage controlled oscillator (VCO) in electrical communication with the primary phase detector, an auxiliary phase detector that receives the reference phase $\Phi_{REF}$ (signal) and the feedback phase $\Phi_{FBK}$ (signal), the auxiliary phase detector providing an adjustment signal to the control circuit that corrects for static phase offset. The VCO provides an output and the feedback phase $\Phi_{FBK}$ (signal).

Another embodiment of the present invention comprises a control circuit that includes a primary phase detector that receives a reference phase $\Phi_{REF}$ (signal) as an input and a feedback phase $\Phi_{FBK}$ (signal) as control feedback, a variable delay that the receives the reference phase $\Phi_{REF}$ (signal), the variable delay being controlled by the primary phase detector, an auxiliary phase detector that receives the reference phase $\Phi_{REF}$ (signal) and the feedback phase $\Phi_{FBK}$ (signal), the auxiliary phase detector providing an adjustment signal to the control circuit that corrects for static phase offset. The variable delay provides an output and the feedback phase $\Phi_{FBK}$ (signal).

BRIEF DESCRIPTION OF THE SEVERAL VIEWS OF THE DRAWINGS

The foregoing summary, as well as the following detailed description of preferred embodiments of the invention, will be better understood when read in conjunction with the appended drawings. For the purpose of illustrating the invention, there are shown in the drawings embodiments which are presently preferred. It should be understood, however, that the invention is not limited to the precise arrangements and instrumentalities shown.

In the drawings:

FIG. 1 is an electrical schematic diagram of a conventional ZDB using a PLL;

FIG. 2 is an electrical schematic diagram of a ZDB using a stabilized PLL in accordance with a preferred embodiment of the present invention;

DETAILED DESCRIPTION OF THE INVENTION

Figure 3:
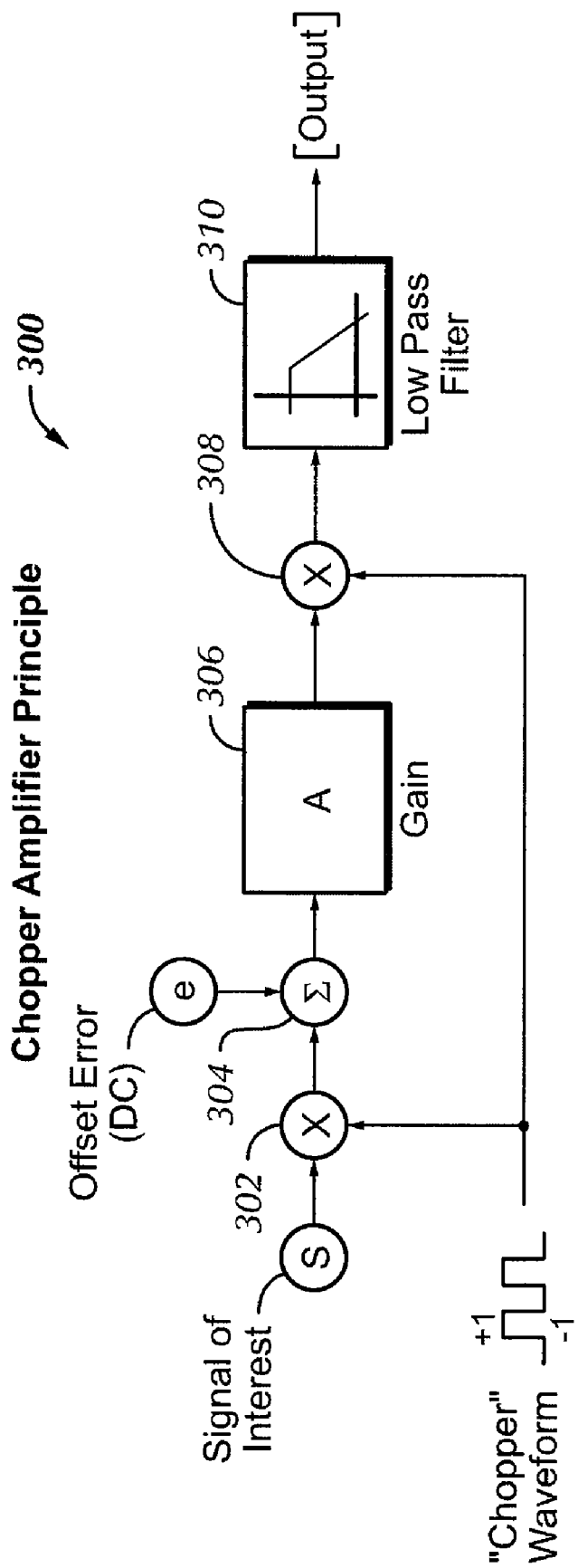
FIG. 3 is an electrical schematic diagram of a chopper amplifier in accordance with preferred embodiments of the present invention.

Certain terminology is used in the following description for convenience only and is not limiting. The words "right," and "left," "lower," and "upper" designate directions in the drawings to which reference is made. The words "inwardly" and "outwardly" refer to directions toward and away from, respectively, the geometric center of the object discussed and designated parts thereof. The terminology includes the words above specifically mentioned, derivatives thereof and words of similar import. Additionally, the words "a" and "an" are used in the claims and in the corresponding portions of the Specification, means "at least one."

Referring to the drawings in detail, wherein like reference numerals indicate like elements throughout, there is shown in FIG. 2 a ZDB control circuit 200 using a stabilized PLL in accordance with a preferred embodiment of the present invention. The ZDB control circuit 200 includes a phase frequency detector 202 that receives a reference phase $\Phi_{REF}$ (signal) as an input and a feedback phase $\Phi_{FBK}$ (signal) as control feedback. The phase frequency detector 202 provides "Up" and "Down" pulse signals to a charge-pump 204. The charge pump 204 provides source current $I_{Source}$ to a loop filter 206 and receives sink current $I_{Sink}$ back from the same node that is coupled to the loop filter 206. The phase frequency detector 202, the charge pump 204 the loop filter 206, and the VCO 208 form a PLL 201. The loop filter 206 is coupled to a voltage controlled oscillator (VCO) 208. The VCO 208 provides an output and the feedback phase $\Phi_{FBK}$ (signal). An auxiliary feedback loop 203 includes a difference amplifier 210 that receives the reference phase $\Phi_{REF}$ (signal) and the feedback phase $\Phi_{FBK}$ (signal). The difference amplifier 210 provides an adjustment signal to the ZDB control circuit 200 which stabilizes the PLL 201 in order to correct for static phase offset (SPO).

Without correction, the main feedback loop (202, 204, 206, 208) develops SPO. This error, or non-zero SPO, is the result of non-ideal behavior of the components of the loop (202, 204, 206, 208). Therefore, the auxiliary loop 203 including the difference amplifier 210 is added to the ZDB control circuit 200. The function of the auxiliary loop 203 with difference amplifier 210 is to measure the SPO and continuously apply a correction of the proper magnitude and direction to the main loop (202, 204, 206, 208) in order to minimize the SPO. In effect, the auxiliary loop 203 via difference amplifier 210 injects a compensating term that negates the errors in the main loop (202, 204, 206, 208), thereby reducing the SPO to approaching zero or ideally zero.

A primary function of the auxiliary feedback loop 203 is substantially the same as the function of a portion of the main loop (202, 204, 206), i.e., measure phase error and deliver a correction. Therefore, the auxiliary loop 203 could have the same or similar error sources as the main loop (202, 204, 206). But, because the auxiliary feedback loop 203 need not be a particularly fast control loop, as compared with the main loop (202, 204, 206, 208), the effect of those errors can be more easily nullified. Therefore, the auxiliary loop 203 can be made to have lower SPO than the PLL or DLL itself. One technique to reduce the SPO of the auxiliary loop 203 includes periodically shorting the inputs to the auxiliary loop phase detector together thereby forcing zero phase error. The resulting error from the phase-frequency detector and charge-pump system in the auxiliary feedback loop 203 could then be stored and subtracted from the result when an actual measurement is performed. Another technique is to create the error difference amplifier as a so-called "chopper amplifier."

FIG. 3 demonstrates a chopper amplifier circuit 300 in accordance with preferred embodiments of the present invention. In the chopper amplifier control circuit 300, a signal of interest S is modulated by a modulator 302 at the input of a gain stage 306 and demodulated by a demodulator 308 at the output of the gain stage 306. Offset error (DC) e is summed at a summing junction 304 with the signal of interest S from input modulator 302. A "chopper" waveform is applied to the input modulator 302 and the output demodulator 308. The operation of the modulator 302 and demodulator 308 are synchronized by this waveform. The modulator 302 and demodulator 308 alternately multiply the value of their respective input signals by either +1 or −1 depending on the logic level of the "chopper" waveform. A low pass filter 310 receives the output from the output demodulator 308. When the chopper signal is "+1," the output from the output demodulator 308, before the low pass filter 310, is generally equal to [(A×S)+(A×e)]. When the chopper signal is "−1," the output from the output demodulator 308, before the low pass filter 310, is generally equal to [(A×S)−(A×e)]. An advantage of such an arrangement is that any DC error e introduced in the gain stage 306 will average out to zero at the output of the final synchronous demodulator 308. The low pass filter 310 performs this averaging. The gain stage 306 therefore need not have very low DC offsets, as all amplification is performed at a higher frequency.

Figure 4:
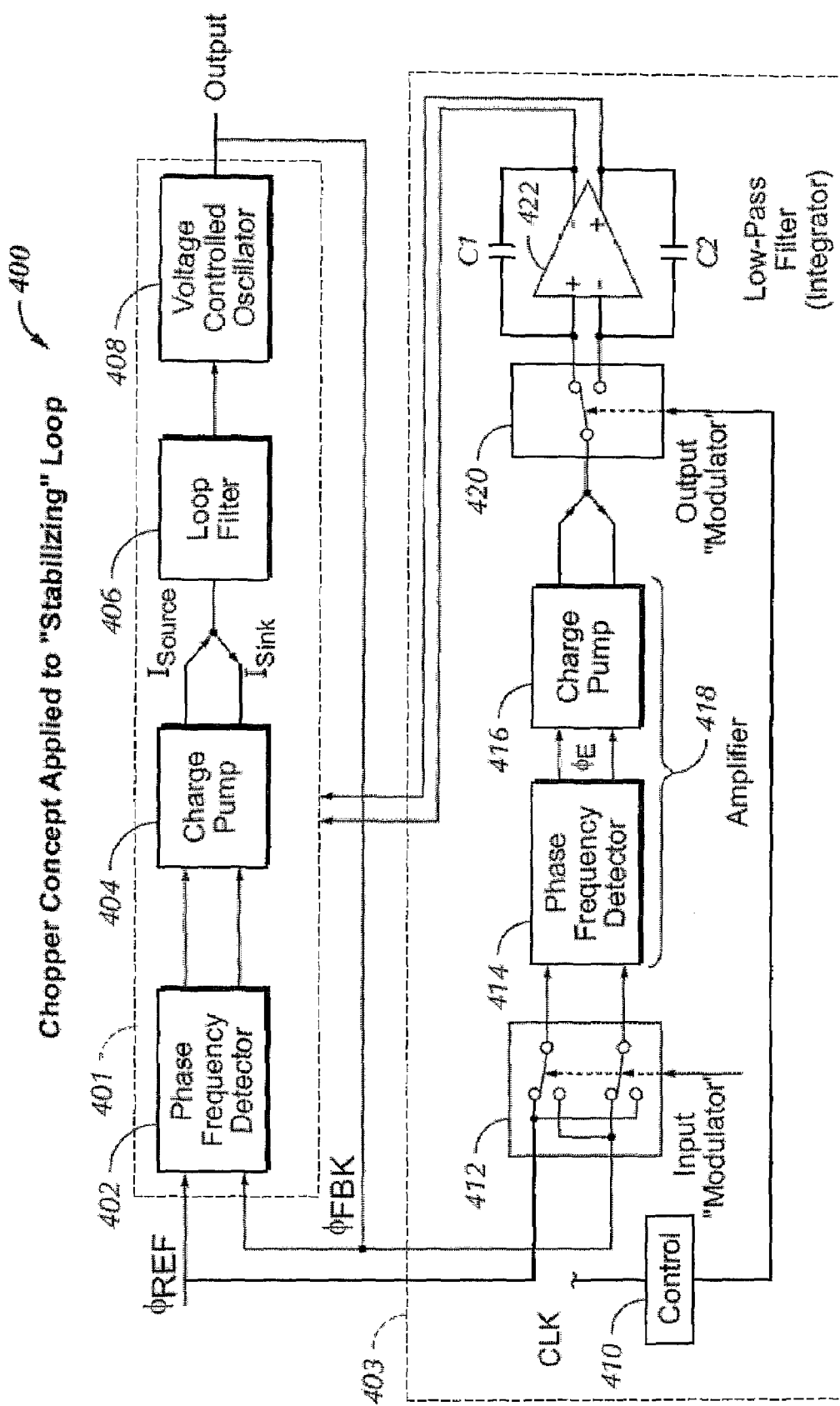
FIG. 4 is an electrical schematic diagram of a chopper amplifier applied to a stabilizing loop in accordance with a preferred embodiment of the present invention.

FIG. 4 shows another preferred implementation of an auxiliary feedback loop in a ZDB control circuit 400 that has a PLL 401. The ZDB control circuit 400 includes a phase frequency detector 402 that receives a reference phase $\Phi_{REF}$ (signal) as an input and a feedback phase $\Phi_{FBK}$ (signal) as control feedback. The phase frequency detector 402 provides "Up" and "Down" pulse signals to a charge-pump 404. The charge pump 404 provides source current $I_{Source}$ to a loop filter 406 and receives sink current $I_{Sink}$ back from the same node that is coupled to the loop filter 406. The phase frequency detector 402, the charge pump 404 and the loop filter 406 form a PLL 401. The loop filter 406 is coupled to a voltage controlled oscillator (VCO) 408. The VCO 408 provides an output and the feedback phase $\Phi_{FBK}$ (signal). An auxiliary feedback loop 403 includes an input modulator 412 that receives each of the reference phase $\Phi_{REF}$ and the feedback phase $\Phi_{FBK}$. The error quantity, i.e., error phase $\Phi_E$ (signal), is sampled and amplified by a phase-frequency detector 414 and a charge-pump 416, just as it is in the main loop (402, 404, 406, 408). The detailed circuit implementation of these two components may be the same as those used in the main loop (402, 404, 406, 408). However, as will be seen, it is not a requirement that the implementation be the same.

FIG. 4 demonstrates an auxiliary loop 403 that includes an amplifier 418 used to form a chopper amplifier with modulator 412, phase frequency detector 414, charge pump 416, output modulator 420, and low-pass filter (integrator) 422. The input modulator 412 may be implemented with a double-pole, double-throw stitch which alternately applies each of the reference phase $\Phi_{REF}$ (signal) and the feedback phase $\Phi_{FBK}$ (signal) in "normal" polarity and "reverse" polarity. The error amplification function of the main loop phase error $\Phi_E$ (signal) is implemented with the conventional phase-frequency detector 414 and charge-pump 416. The output demodulator 420 is implemented with a single pole, double-throw switch. The "normal" and "reverse" polarities are thus independently integrated on a differential-input, differential-output integrator. The differential voltage developed at the output of this integrator is the integral of the actual phase error between reference phase $\Phi_{REF}$ and feedback phase $\Phi_{FBK}$ outputs. The control signal to drive the modulator 412 and demodulator 420 can be derived from a reference clock directly, or can be derived from a divided-down version of the reference clock, or another signal entirely.

The auxiliary feedback loop 403 provides chopper stabilization of SPO of the ZDB 400.

Figure 5:
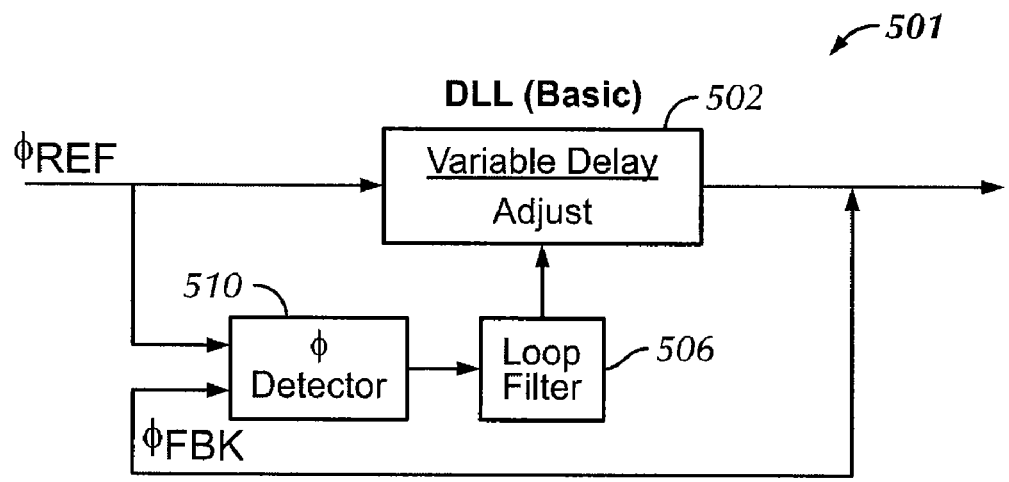
FIG. 5 is an electrical schematic diagram of a conventional ZDB using a DLL.

While described herein as used with a PLL circuit 201, 401, embodiments of the present invention could equally be implemented as a delay locked loop (DLL). For example, FIG. 5 is a ZDB using DLL 501. In order to create a stabilized DLL in accordance with a preferred embodiment of the present invention, an auxiliary feedback loop 203 can be coupled to the DLL 501 as shown in FIG. 6.

Figure 6:
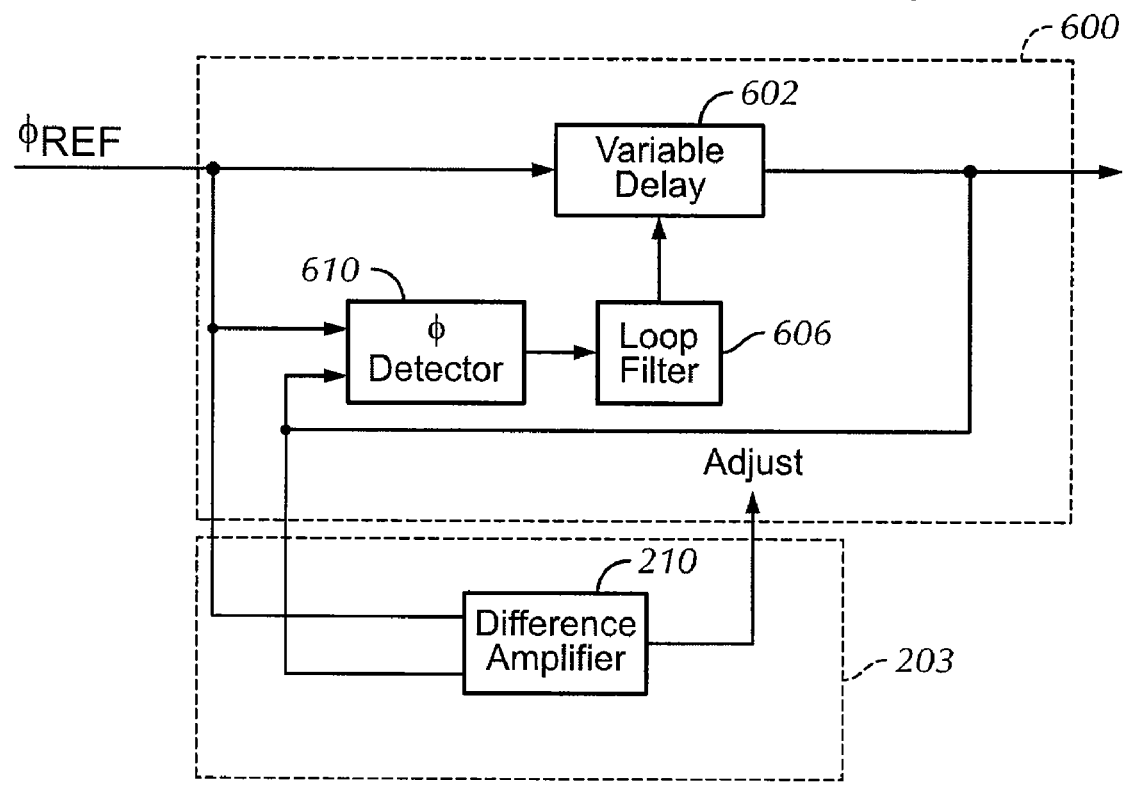
FIG. 6 is an electrical schematic diagram of a ZDB using stabilized DLL in accordance with a preferred embodiment of the present invention.

Referring to FIG. 6, the auxiliary feedback loop 203, described above, includes a difference amplifier 210 that receives the reference phase $\Phi_{REF}$ (signal) and the feedback phase $\Phi_{FBK}$ (signal). A DLL 601 includes a variable delay 602, a loop filter 606 and a phase comparator 610. The variable delay 602 receives a reference phase $\Phi_{REF}$ (signal) as an input and outputs an output which is also used as a feedback phase $\Phi_{FBK}$ (signal). The phase comparator 610 receives a reference phase $\Phi_{REF}$ (signal) as an input and a feedback phase $\Phi_{FBK}$ (signal) as control feedback. The output of the phase comparator 610 is applied through the loop filter 606 and to the Adjust input of the variable delay 602 in order to adjust the DLL 610.

The following describes one possible way that SPO could develop in a PLL-based ZDB.

Figure 8:
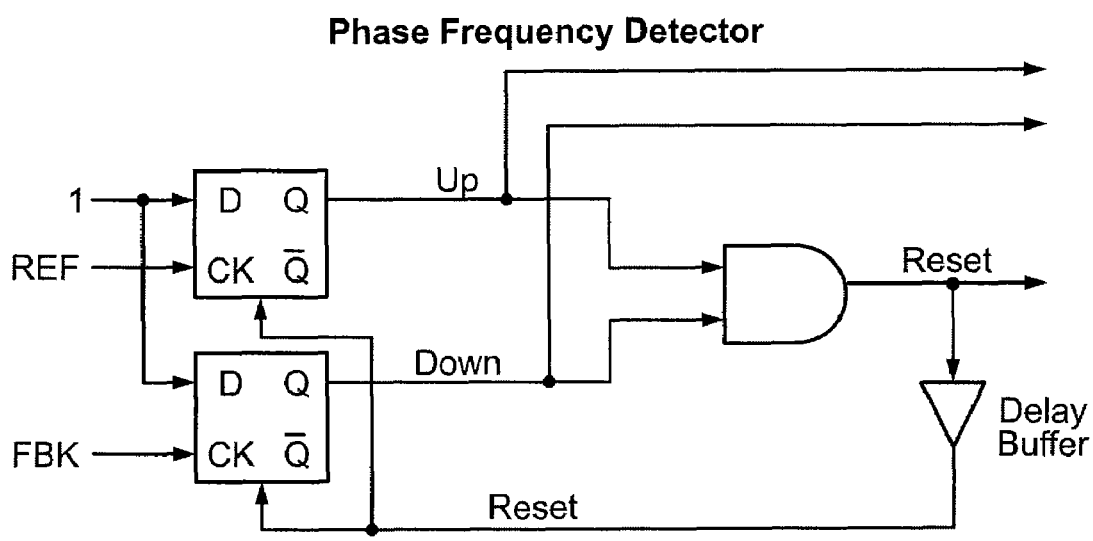
FIG. 8 is an electrical schematic diagram of a phase frequency detector circuit in accordance with preferred embodiments of the present invention.
Figure 11:
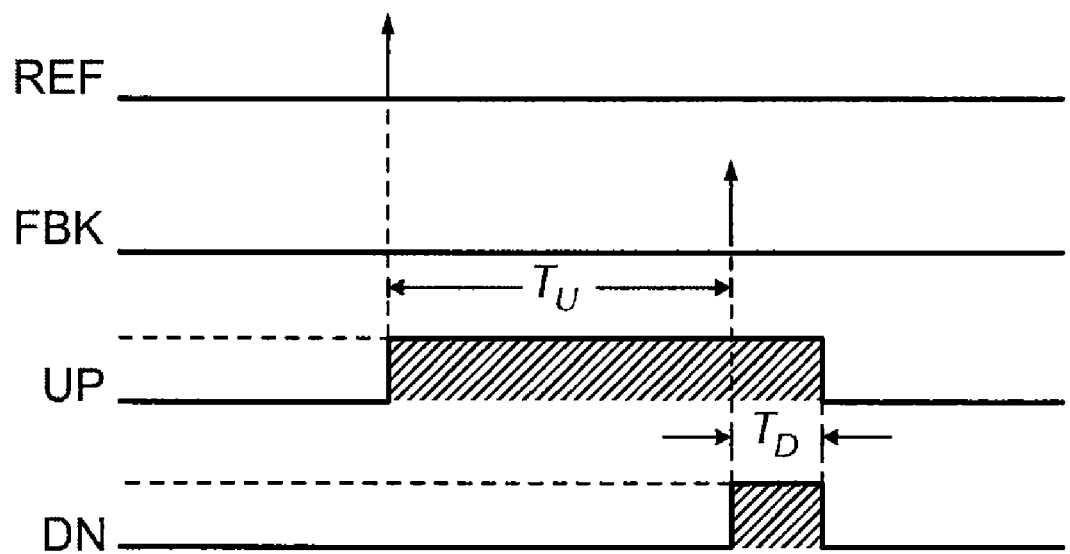
FIG. 11 is a timing diagram demonstrating a phase of a clock REF edge being early compared with a clock FBK edge and also demonstrates the behavior of a phase/frequency detector.

FIG. 8 is an electrical schematic diagram of one possible implementation of a phase frequency detector circuit (PFD) in accordance with preferred embodiments of the present invention. The main function of the PFD in a PLL is to control the speed of the VCO (see e.g., 208 and 408) in the proper direction. A pair of D-type flip flops provides the outputs for Up and Down signals based on the reference and feedback signals. Up and Down are also applied to an AND-gate, which could also be a NAND-gate depending on the required reset logic, in order to provide a reset to the D-type flip flops. Optionally, a delay buffer may be provided to ensure that adjustments to Up and Down are made for very small phase differences. In operation, suppose the phase of the clock REF edge is early compared with the clock FBK edge as shown in FIG. 11. The logical UP output is asserted upon the clock REF edge, and then the clock FBK edge occurs causing the DN output to be asserted. Now that both outputs are true, the reset circuit forces both outputs to become de-asserted. Note that the DN pulse was only asserted for a very short time. The relative widths of the UP and DN pulses, $T_U$ and $T_D$, are an indication of the phase difference between the REF and FBK signals.

Figure 12:
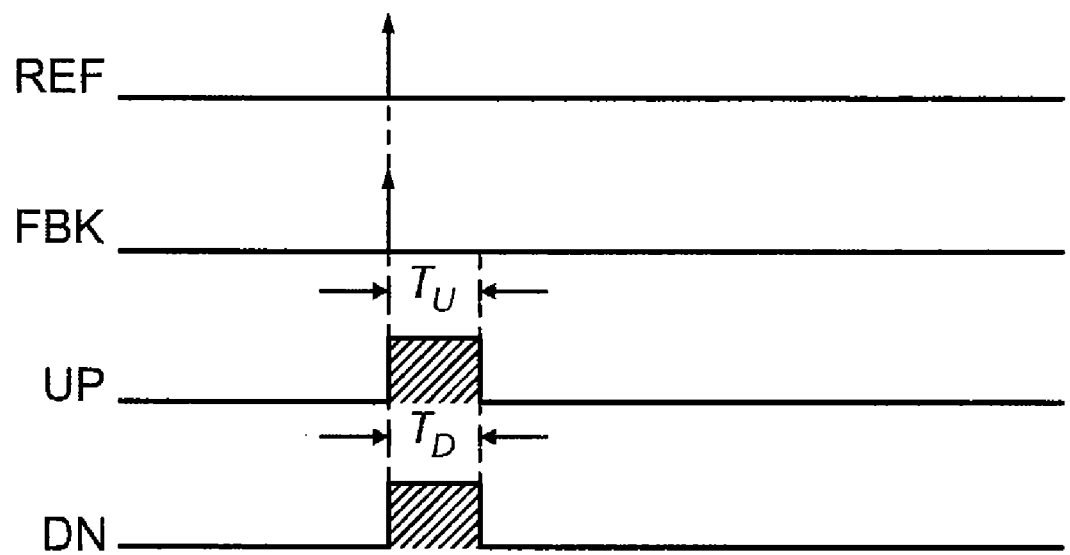
FIG. 12 is a timing diagram demonstrating when behavior of all components of the PLL is nearly ideal.

Referring to conventional PLL 100 shown in FIG. 1, the PLL 100 is a negative-feedback system that will attempt to find a condition (which is referred to here as "locked") where the quantity of source charge $Q_{source}$ and the quantity of sink charge $Q_{sink}$ equal zero as applied to the loop filter 106. When this condition has occurred, no net charge is transferred to the loop filter 106, and the frequency of the VCO 108 will remain constant. If the behavior of all components of the PLL is ideal and the $I_{source}$ and $I_{sink}$ currents are well matched, the UP and DN signals from the PFD 102 will appear as shown in FIG. 12, with TU and TD being equal in duration, and the phase of the REF and FBK inputs will also be equal.

Next, consider non-ideal behavior in one of the PLL components, specifically charge pump 104. Suppose that the $I_{Source}$ and $I_{Sink}$ currents are not exactly equal to each other. When the loop has achieved the "locked" condition, the pulse widths, $T_U$ and $T_D$, must therefore also be unequal to satisfy the charge equality condition at lock:

$$Q_{source} = Q_{sink} \text{ or: } I_{SOURCE} \times T_U = I_{SINK} \times T_D$$

Figure 9:
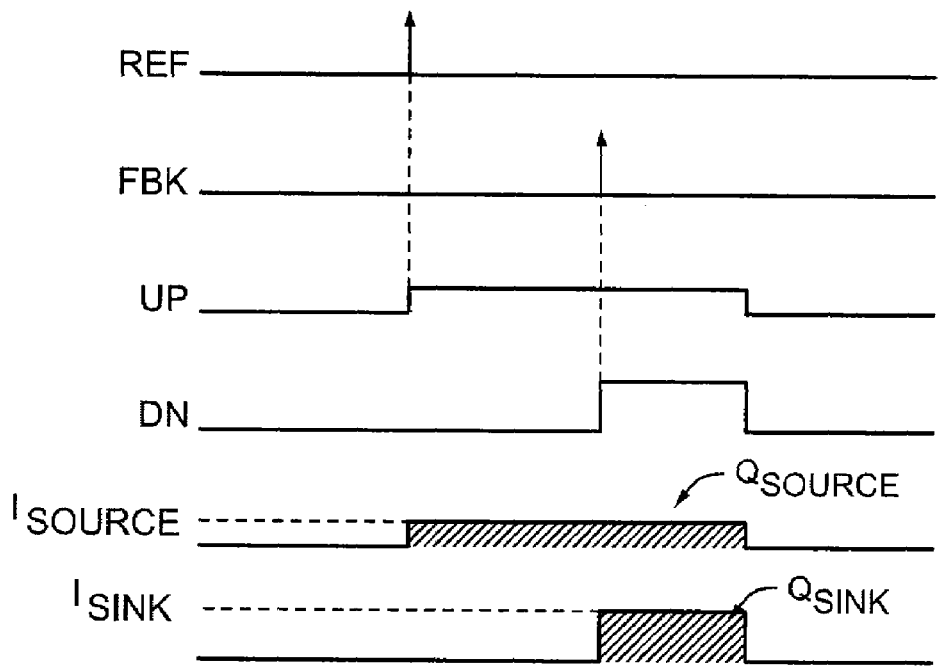
FIG. 9 is a timing diagram demonstrating non-ideal behavior in a ZDB circuit.

Referring to FIG. 9, since the trailing edges of $T_U$ and $T_D$ always occur at the same time because of the simultaneous reset from the phase-frequency detector, the phase of the reference and feedback edges must therefore be misaligned, since it is those edges that control the leading edges of $T_U$ and $T_D$ respectively.

This is one example of how non-ideal behavior in one of the components of the PLL can cause SPO. Similar non-ideal behavior in other components of the PLL may affect the SPO also.

Figure 7:
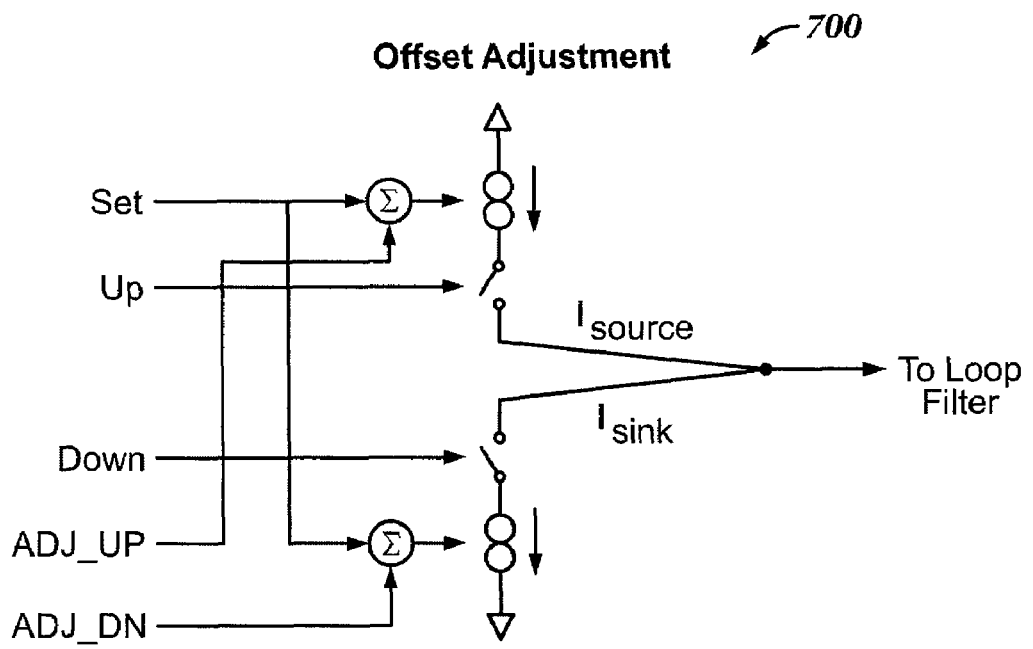
FIG. 7 is an electrical schematic diagram of an offset adjustment circuit in accordance with preferred embodiments of the present invention.

FIG. 7 is an example of one possible implementation of an offset adjustment circuit 700 in accordance with preferred embodiments of the present invention. Control parameter ADJ_UP is summed with parameter Set to control the source current $I_{source}$ and control parameter ADJ_DN is summed with parameter Set to control the sink current $I_{sink}$. Initially, suppose that control parameters ADJ_UP and ADJ_DN are both equal to zero. Then, the values of $I_{source}$ and $I_{sink}$ will be nominally equal to each other and completely controlled by the SET parameter. The charge pump will behave in a normal fashion. When the PLL has achieved the "locked" condition, the phase of the REF and FBK inputs will be aligned, or equal. Now, suppose that the value of control parameter ADJ_UP is increased and the value of control parameter ADJ_DN is decreased. The value of $I_{source}$ will be increased and the value of $I_{sink}$ will be decreased. From the previous discussion, at the "locked" condition, the width of $T_U$ will become smaller compared with Td to keep the relative areas (equivalent to charge) equal to each other. Therefore, the phase of the FBK edge will be advanced (earlier) compared with the REF edge. The opposite will be true if we decrease ADJ_UP and increase ADJ_DN. The phase of the FBK edge will become delayed compared with the REF edge. So, there is now a means to move the relative phase of the REF and FBK edges relative to each other during the "locked" condition.

Figure 10:
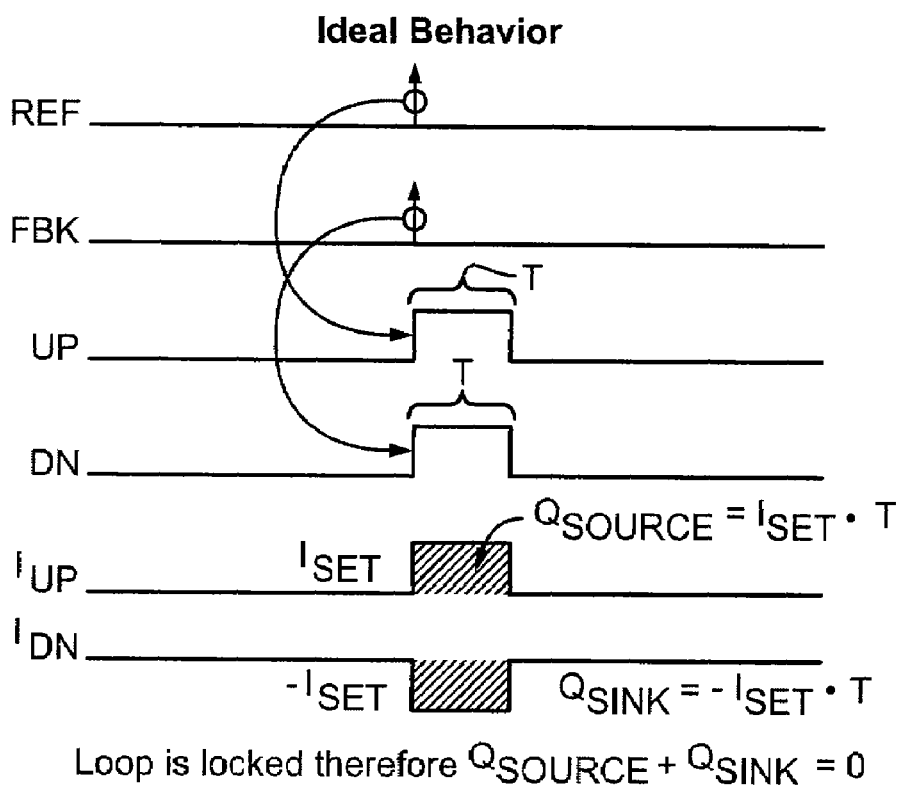
FIG. 10 is a timing diagram demonstrating ideal behavior in a ZDB circuit.

FIG. 10 is a timing diagram demonstrating ideal or nearly ideal behavior in a ZDB circuit. the reset time T includes the inherent circuit delay plus a selected delay time. Again, the loop is locked when the quantity of source charge $Q_{source}$ and the quantity of sink charge $Q_{sink}$ equal zero (i.e., the area under the current pulse), therefore the reference signal REF and feedback signal FBK are synchronized.

From the foregoing, it can be seen that embodiments of the present invention comprise a PLL and/or a DLL with chopper stabilized phase offset. It will be appreciated by those skilled in the art that changes could be made to the embodiments described above without departing from the broad inventive concept thereof. It is understood, therefore, that this invention is not limited to the particular embodiments disclosed, but it is intended to cover modifications within the spirit and scope of the present invention as defined by the appended claims.

I claim:

1. A control circuit comprising:
A phase detector that receives a reference phase $\phi_{REF}$ (signal) as an input and a feedback phase $\phi_{FBK}$ (signal) as control feedback;
A voltage controlled oscillator (VCO) in electrical communication with the phase detector, the VCO providing an output and the feedback phase $\phi_{FBK}$ (signal), the phase detector and the VCO forming at least a portion of a main loop; and
An auxiliary feedback loop having a phase-frequency detector that, continuously and simultaneously with the phase detector of the main loop, receives the reference phase $\phi_{REF}$ (signal) and the feedback phase $\phi_{FBK}$ (signal), the auxiliary feedback loop continuously providing an adjustment signal to the main loop that corrects for static phase offset;
wherein the auxiliary feedback loop includes a charge-pump and an input modulator that receives the reference phase $\phi_{REF}$ (signal) and the feedback phase $\phi_{FBK}$ (signal), the reference phase $\phi_{REF}$ (signal) and the feedback phase $\phi_{FBK}$ (signal) are compared to determine an error phase signal, the error phase signal is amplified by the phase-frequency detector and the charge-pump, and wherein an output of the charge-pump is rectified and filtered.

2. The control circuit according to claim 1, wherein the auxiliary feedback loop includes a difference amplifier.

3. The control circuit according to claim 1, wherein the main loop is a phase locked loop (PLL).

4. The control circuit according to claim 1, wherein the control circuit is a zero delay buffer (ZDB) and the auxiliary feedback loop provides chopper stabilization of static phase offset (SPO) of the ZDB.

5. The control circuit according to claim 1, further comprising:
a charge pump in electrical communication with the phase frequency detector, the phase frequency detector providing up and down pulse signals to the charge-pump; and
a loop filter in electrical communication with the charge pump, the charge pump providing source current $I_{Source}$ to the loop filter receiving sink current $I_{Sink}$ back from a node that is coupled to the loop filter, the voltage controlled oscillator (VCO) in electrical communication with the loop filter.

6. A control circuit comprising:
A primary phase detector that receives a reference phase $\phi_{REF}$ (signal) as an input and a feedback phase $\phi_{FBK}$ (signal) as control feedback;
A variable delay that receives the reference phase $\phi_{REF}$ (signal), the variable delay being controlled by the phase detector, the variable delay providing an output and the feedback phase $\phi_{FBK}$ (signal), the phase detector and the variable delay forming at least a portion of a main loop; and
An auxiliary feedback loop having a phase-frequency detector that, continuously and simultaneously with the phase detector of the main loop, receives the reference phase $\phi_{REF}$ (signal) and the feedback phase $\phi_{FBK}$ (signal), the auxiliary feedback loop continuously providing an adjustment signal to the main loop that corrects for static phase offset;
wherein the auxiliary feedback loop includes a charge-pump and an input modulator that receives the reference phase $\phi_{REF}$ (signal) and the feedback phase $\phi_{FBK}$ (signal), the reference phase $\phi_{REF}$ (signal) and the feedback phase $\phi_{FBK}$ (signal) are compared to determine an error phase signal, the error phase signal is amplified by the phase-frequency detector and the charge-pump, and wherein an output of the charge-pump is rectified and filtered.

7. The control circuit according to claim 6, wherein the auxiliary feedback loop includes a difference amplifier.

8. The control circuit according to claim 6, wherein the main loop is a delay locked loop (DLL).

9. The control circuit according to claim 8, wherein the control circuit is a zero delay buffer (ZDB) and the auxiliary feedback loop provides chopper stabilization of static phase offset (SPO) of the ZDB.

10. A control circuit comprising:
A primary phase detector that receives a reference phase $\phi_{REF}$ (signal) as an input and a feedback phase $\phi_{FBK}$ (signal) as control feedback;
A voltage controlled oscillator (VCO) in electrical communication with the primary phase detector, the VCO providing an output and the feedback phase $\phi_{FBK}$ (signal), the phase detector and the VCO forming at least a portion of a main loop; and
An auxiliary phase detector that, continuously and simultaneously with the primary phase detector, receives the reference phase $\phi_{REF}$ (signal) and the feedback phase $\phi_{FBK}$ (signal) from an input modulator that receives the reference phase $\phi_{REF}$ (signal) and the feedback phase $\phi_{FBK}$ (signal), the auxiliary phase detector providing an adjustment signal to the main loop that corrects for static phase offset, wherein the reference phase $\phi_{REF}$ (signal) and the feedback phase $\phi_{FBK}$ (signal) are compared to determine an error phase signal, the error phase signal is amplified by the auxiliary phase detector and a charge-pump, and wherein an output of the charge-pump is rectified and filtered.

11. A control circuit comprising:

A phase detector that receives a reference phase $\phi_{REF}$ (signal) as an input and a feedback phase $\phi_{FBK}$ (signal) as control feedback;

A variable delay that receives the reference phase $\phi_{REF}$ (signal), the variable delay being controlled by the phase detector, the variable delay providing an output and the feedback phase $\phi_{FBK}$ (signal), the phase detector and the variable delay forming at least a portion of a main loop; and An auxiliary phase detector that, continuously and simultaneously with the primary phase detector, receives the reference phase $\phi_{REF}$ (signal) and the feedback phase $\phi_{FBK}$ (signal) from an input modulator that receives the reference phase $\phi_{REF}$ (signal) and the feedback phase $\phi_{FBK}$ (signal), the auxiliary phase detector providing an adjustment signal to the main loop that corrects for static phase offset, wherein the reference phase $\phi_{REF}$ (signal) and the feedback phase $\phi_{FBK}$ (signal) are compared to determine an error phase signal, the error phase signal is amplified by the auxiliary phase detector and a charge-pump, and wherein an output of the charge-pump is rectified and filtered.

* * * * *